(12) United States Patent
Jacob et al.

(10) Patent No.: US 11,233,191 B2
(45) Date of Patent: Jan. 25, 2022

(54) INTEGRATED CIRCUITS WITH EMBEDDED MEMORY STRUCTURES AND METHODS FOR FABRICATING THE SAME

(71) Applicant: GLOBALFOUNDRIES U.S. Inc., Santa Clara, CA (US)

(72) Inventors: Ajey P. Jacob, Malta, NY (US); Eswar Ramanathan, Malta, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/142,432

(22) Filed: Sep. 26, 2018

(65) Prior Publication Data

US 2020/0098976 A1 Mar. 26, 2020

(51) Int. Cl.
| | | |
|---|---|---|
| *H01L 43/00* | (2006.01) | |
| *H01L 43/02* | (2006.01) | |
| *H01L 43/12* | (2006.01) | |
| *H01L 27/22* | (2006.01) | |

(52) U.S. Cl.
CPC ............ *H01L 43/02* (2013.01); *H01L 27/222* (2013.01); *H01L 43/12* (2013.01)

(58) Field of Classification Search
CPC ........ H01L 43/02; H01L 27/222; H01L 43/12
See application file for complete search history.

(56) References Cited

U.S. PATENT DOCUMENTS

| | | | |
|---|---|---|---|
| 7,582,941 B2 | 9/2009 | Cho et al. | |
| 7,880,249 B2 | 2/2011 | Yuan et al. | |
| 10,008,387 B1* | 6/2018 | Wang | ................ H01L 21/31053 |
| 10,483,121 B2* | 11/2019 | Wang | ................ H01L 21/76819 |
| 2008/0220374 A1 | 9/2008 | Kanakasabapathy et al. | |
| 2009/0261433 A1 | 10/2009 | Kang et al. | |
| 2009/0261434 A1 | 10/2009 | Kang et al. | |
| 2015/0325622 A1* | 11/2015 | Zhang | ..................... H01L 43/08 257/421 |
| 2018/0212140 A1* | 7/2018 | Noh | ........................ H01L 43/10 |
| 2018/0286694 A1* | 10/2018 | Wang | ................ H01L 21/76819 |
| 2020/0144172 A1* | 5/2020 | Chen | ...................... H01L 43/12 |

* cited by examiner

*Primary Examiner* — Mounir S Amer
*Assistant Examiner* — Alexander Belousov
(74) *Attorney, Agent, or Firm* — Yee Tze Lim; Hoffman Warnick LLC

(57) ABSTRACT

Integrated circuits with embedded memory structures, and methods for fabricating integrated circuits are provided. An exemplary method for fabricating an integrated circuit includes forming first and second conductive interconnects over a semiconductor substrate. The method includes depositing a conductive material over the first conductive interconnect. Also, the method includes forming a memory structure over the conductive material, wherein the memory structure has an uppermost surface distanced from the first conductive interconnect by a first height. Further, the method includes forming an interlayer dielectric over the memory structure and forming a conductive via coupled to the second conductive interconnect, wherein the conductive via has a second height over the second conductive interconnect less than the first height. The method also includes forming first and second contact plugs through the interlayer dielectric. The first contact plug contacts the memory structure and the second contact plug contacts the conductive via.

13 Claims, 6 Drawing Sheets

INTEGRATED CIRCUITS WITH EMBEDDED MEMORY STRUCTURES AND METHODS FOR FABRICATING THE SAME

TECHNICAL FIELD

The technical field generally relates to sophisticated semiconductor devices and the manufacturing of such devices, and, more specifically, to integrated circuits with memory structures embedded in metallization layers.

BACKGROUND

As the density of memory devices in integrated circuits increases, integration of such devices in back end of line (BEOL) processing becomes difficult. For example, placement of memory devices within the metallization layers is challenging.

For magnetoresistive random access memory (MRAM) technology, memory structures such as magnetic tunnel junction (MTJ) stacks may require greater heights than those of the metallization vertical interconnect access (vias) in existing processing. As a result, simple substitution of MTJ stacks at the locations of metallization vias is impractical. Specifically, the formation of embedded memory structures is limited by the height of metallization layers.

Accordingly, it is desirable to provide improved integrated circuits with embedded memory structures, and improved methods for fabricating such structures. It is further desirable to provide a memory structure with improved performance. It is also desirable to provide methods for fabricating integrated circuits with high density memory structures that are less expensive and less time consuming than current methods. Furthermore, other desirable features and characteristics will become apparent from the subsequent detailed description and the appended claims, taken in conjunction with the accompanying drawings and this background.

BRIEF SUMMARY

Integrated circuits with embedded memory structures, and methods for fabricating integrated circuits are provided. An exemplary method for fabricating an integrated circuit includes forming a first conductive interconnect and a second conductive interconnect over a semiconductor substrate. The method includes depositing a conductive material over the first conductive interconnect. Also, the method includes forming a memory structure over the conductive material, wherein the memory structure has an uppermost surface distanced from the first conductive interconnect by a first height. Further, the method includes forming an interlayer dielectric over the memory structure and forming a conductive via coupled to the second conductive interconnect, wherein the conductive via has a second height over the second conductive interconnect less than the first height. The method also includes forming a first contact plug and a second contact plug through the interlayer dielectric. The first contact plug contacts the memory structure and the second contact plug contacts the conductive via.

In another embodiment, an integrated circuit with an embedded memory structure is provided. The integrated circuit includes a conductive interconnect disposed over a semiconductor substrate. The integrated circuit further includes a conductive layer formed from cobalt material disposed directly on the conductive interconnect. Also, the integrated circuit includes a memory structure disposed directly on the conductive layer formed from cobalt material. Further, the integrated circuit includes a contact plug coupled to the memory structure.

In yet another exemplary embodiment, an integrated circuit with an embedded magnetic tunnel junction (MTJ) structure includes a conductive interconnect disposed over a semiconductor substrate. The integrated circuit also includes a bottom layer of highly conductive material disposed over the first conductive interconnect. Also, the integrated circuit includes a magnetic tunnel junction (MTJ) stack disposed over the highly conductive bottom layer. The integrated circuit also includes a contact plug contacting the MTJ stack.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
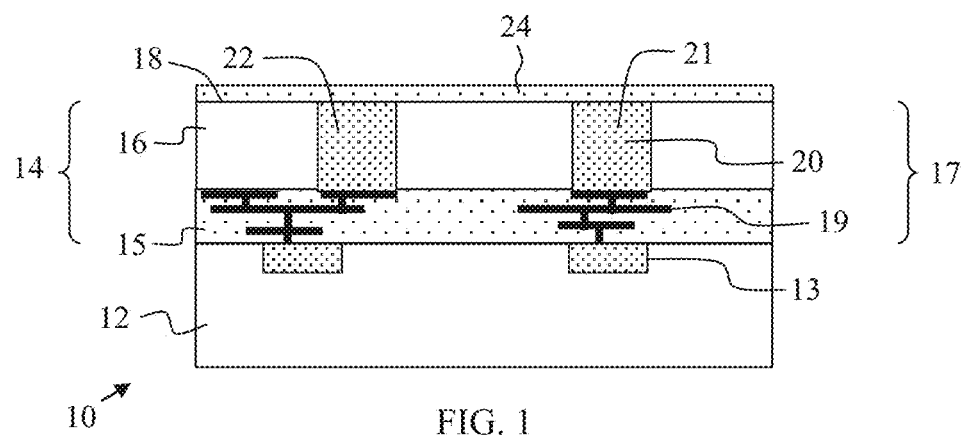
FIGS. 1-13 are cross sectional schematic views of integrated circuit fabrication processing for forming an integrated circuit with a memory structure embedded in a metallization layer in accordance with embodiments herein.

The following detailed description is merely exemplary in nature and is not intended to limit the integrated circuits with embedded memory structures and methods for fabricating such integrated circuits. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various processes in the fabrication memory devices are well-known and so, in the interest of brevity, many conventional processes will only be mentioned briefly herein or will be omitted entirely without providing the well-known process details. Further, it is noted that integrated circuits with memory structure, include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "under", "lower", "higher" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Further, as used herein, a layer identified as a "material layer" or as being a "material" includes at least 50 wt. % of the recited material. As used herein, a layer identified as a "primarily material layer" or as being "primarily material" is a layer that includes at least 90 wt. % of the recited material.

As will be readily apparent to those skilled in the art upon a complete reading of the disclosure, the devices disclosed herein may be employed with a variety of technologies, and may be incorporated into a variety of integrated circuit products. With reference to the attached drawings, various illustrative embodiments of the methods and devices disclosed herein will now be described in more detail. It should be understood that the various features and layers in the attached drawings may not be to scale.

Embodiments herein are directed towards memory structures, for example magnetoresistive random access memory (MRAM) structures or resistive random access memory (RRAM) structures, arrays of such structures, and various methods of fabricating such structures or arrays. As described herein, an exemplary memory structure is embedded in metallization layer in which a neighboring metallization contact or conductive via is formed in a laterally adjacent location. In exemplary embodiments, the memory structure is formed with a height greater than the height of the conductive via. Further, in certain embodiments, the memory structure is provided with a desired critical dimension, or width, in contact with an underlying conductive interconnect, while a neighboring metallization contact retains a narrower critical dimension, or contact width, to a neighboring conductive interconnect. It is noted that the critical dimension may be different in an X-direction (the lateral dimension in the plane of the drawings) and/or Y-direction (the lateral direction perpendicular to the plane of the drawings), either of which may be referred to as width.

FIGS. 1-13 depict an embodiment of a method for fabricating an integrated circuit device 10, including a non-volatile memory structure. Specifically, the illustrated method may be used to fabricate a memory structure. More particularly, the illustrated method is useful for fabricating a memory embedded in a metallization layer in an integrated circuit. In FIG. 1, a partially fabricated integrated circuit device 10 is illustrated and is formed in or on or includes a substrate 12. An exemplary substrate 12 is a semiconductor substrate. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon on an insulating layer (in a structure commonly known as semiconductor-on-insulator or SOI) that, in turn, is supported by a carrier wafer. The insulating layer, for example, may be formed of a dielectric insulating material. An exemplary insulating layer is from silicon oxide, which provides a buried oxide (BOX) layer. Other types of dielectric insulating materials may also be useful. The SOI substrate, for example, may be a fully depleted silicon-on-insulator (FDSOI) substrate. For example, the thin surface and bulk layers may be single crystalline silicon. Other types of SOI substrates may also be useful. It is understood that the surface and bulk layers need not be formed of the same material.

In FIG. 1, semiconductor devices 13, such as metal oxide field effect transistors (MOSFETs), capacitors, resistors, and the like are formed in the semiconductor substrate 12 according to conventional integrated circuit processing. The devices 13 formed in FIG. 1 during a series of processes that form individual integrated circuit components, e.g., transistors, capacitors, resistors, etc., over substrate 12 may be interconnected into a circuit by means of one or more metal interconnecting layers, i.e., metallization layers.

In an exemplary embodiment, various metal and dielectric layer deposition and etching processes may be performed according to conventional integrated circuit processing to form a dielectric 14 with an embedded metallization structure 17 in selective contact with devices 13. As shown, the dielectric 14 may include a lower portion 15 formed of layers of dielectric and an uppermost dielectric layer 16 that is formed over the lower portion 15. Further, the embedded metallization structure 17 may include a lower portion 19, that is embedded in the lower portion 15 of dielectric 14, and a conductive interconnect 20, including a first conductive interconnect 21 and a second conductive interconnect 22, that is formed over the lower portion 19 and in the uppermost dielectric layer 16. As shown, a planar upper surface 18 is defined by the uppermost dielectric layer 16 and the conductive interconnect 20. While a plurality of layers of the metallization structure 17 and dielectric 14 are shown, it is contemplated that dielectric layer 16 and conductive interconnect 20 be formed as the only components of the dielectric 14 and metallization structure 17, respectively, and in direct contact with the underlying substrate 12 and devices 13. In other words, the lower portion 15 of the dielectric 14 and the lower portion 19 of the metallization structure 17 are optional. Further, the figures are not drawn to scale, but provide an exploded view of dielectric layer 16 and conductive interconnect 20 in FIG. 1, and show only the dielectric layer 16 and conductive interconnect 20 and overlying layers in FIGS. 2-13, for purposes of emphasis and clarity.

In an exemplary embodiment, the metallization structure 17, including the conductive interconnect 20, is formed utilizing a damascene process. Further, an exemplary metallization structure 17, including the conductive interconnect 20, is copper, though other suitable conductive materials may be used.

As shown in FIG. 1, a blocking layer 24 is formed over the upper surface 18 of the dielectric layer 16 and conductive interconnect 20. An exemplary blocking layer 24 may be provided to block or prevent contact between the conductive interconnect 20 and later deposited interlayer dielectric and/or to serve as an etch stop layer (ESL) during later processing. An exemplary blocking layer 24 is an insulating or dielectric material, such as nitrogen doped carbide (NDC), nitrogen-doped silicon carbide diffusion layer, aluminum nitrogen oxide, or any advanced etch stop layers. The blocking layer 24 may be formed as a stack of at least two different sublayers. The blocking layer 24 may be deposited using chemical vapor deposition (CVD) or plasma enhanced CVD (PE-CVD) processes. The method may include polishing the blocking layer 24 using a chemical mechanical planarization/polish (CMP) process.

Figure 2:
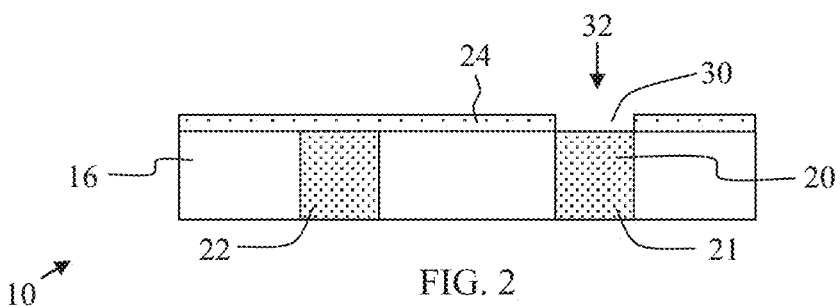

In FIG. 2, the blocking layer 24 is selectively patterned to form an opening 30 in a memory region 32, i.e., where formation of a memory structure is intended, over the first conductive interconnect 21. The blocking layer 24 may be selectively patterned by masking and etching the blocking layer 24 according to conventional lithography processing.

Figure 3:
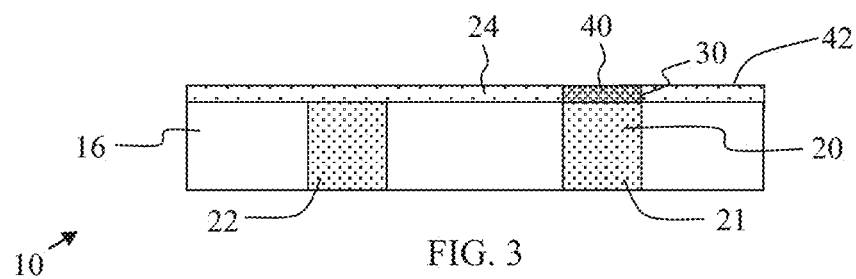

The method may continue in FIG. 3 with deposition of a conductive material 40 over the first conductive interconnect 21. In an exemplary embodiment, the conductive material 40 is highly conductive. As used herein, "highly conductive" refers to a material that has a resistivity of from about 1 $\Omega$·cm to about 50 $\Omega$·cm at room temperature (for sub 22 nm technology nodes) and has comparable or less than copper via resistance at the same technology node; otherwise, at certain dimensions a highly conductive material, such as cobalt, may show lower resistance due to lower mean free path than copper. This may facilitate scaling down further without a significant increase in electron scattering. In an exemplary embodiment, the conductive material 40 is cobalt. Further, the conductive material 40 may be primarily cobalt. Other suitable conductive materials 40 may include cobalt alloys, such as alloys of cobalt and titanium (Co—Ti), cobalt and molybdenum (Co—Mo), cobalt and tungsten (Co—W), and cobalt and silicon (Co—Si).

The conductive material 40 may be selectively deposited. In an exemplary embodiment, the conductive material is deposited by CVD or atomic layer deposition (ALD) processes. The conductive material 40 may be deposited to flush fill the opening 30, or may be deposited with an overburden above and/or outside the opening, which can be removed by a CMP process. As shown in FIG. 3, the blocking layer 24 and conductive material 40 form a planar upper surface 42. In an exemplary embodiment, the blocking layer 24 and conductive material 40 have a thickness or height of no more than about 30 nanometers (nm), such as from about 10 to about 30 nm.

Figure 4:
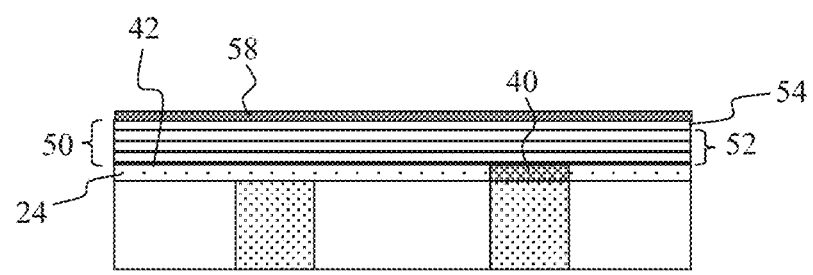

The method may continue in FIG. 4 with the deposition of memory structure layers 50 over the upper surface 42 of the blocking layer 24 and conductive material 40. In an exemplary embodiment, the memory structure layers 50 include MTJ layers 52, such as a magnetically fixed layer or polarizer layer, a tunnel barrier layer or layers, a magnetically free layer or storage layer, seed layers, wetting layers, spacer layers, anti-ferromagnetic layers, and the like. It is realized that the MTJ layers 52 of many variations may be provided that are within the scope of the present disclosure. The MTJ layers 52 may be deposited using physical vapor deposition (PVD), CVD and/or ALD techniques.

In an exemplary embodiment, the memory structure layers 50 further include a capping layer 54 disposed over the MTJ layers 52. An exemplary capping layer 54 is formed from cobalt. For example, the capping layer 54 may be formed from cobalt deposited by PVD. Further, in an exemplary embodiment, the capping layer 54 has a thickness of from about 1 nm to about 5 nm, such as about 2 nm.

As is further shown in FIG. 4, the method includes depositing a protective etch stop layer 58 over the memory structure layers 50, such as directly on the capping layer 54. In an exemplary embodiment, the protective etch stop layer 58 is titanium nitride (TiN), aluminum nitride (AlN), and/or any other suitable material that can be selectively removed. In an exemplary embodiment, the protective etch stop layer 58 has a thickness of from about 20 to about 50 nm. In an exemplary embodiment, the protective etch stop layer 58 is formed by a CVD or PVD process.

Figure 5:
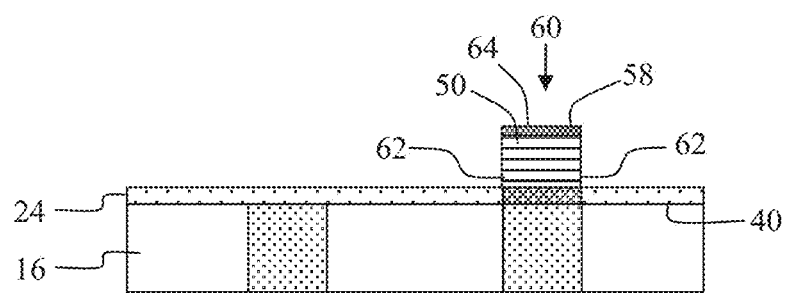

In FIG. 5, the method may continue with the patterning of the memory structure layers 50 and the protective etch stop layer 58. Specifically, the memory structure layers 50 and the protective etch stop layer 58 may be selectively patterned by masking and etching according to conventional lithography processing. As a result, a memory structure stack 60, such as an MTJ stack, is formed over the conductive material 40. In an exemplary embodiment the memory structure stack 60 completely covers the conductive material 40. As y shown, the memory structure stack 60 is formed with opposite sidewalls 62 and with a top surface 64 extending from sidewall to sidewall. The top surface 64 is formed entirely by the protective etch stop layer 58.

Figure 6:
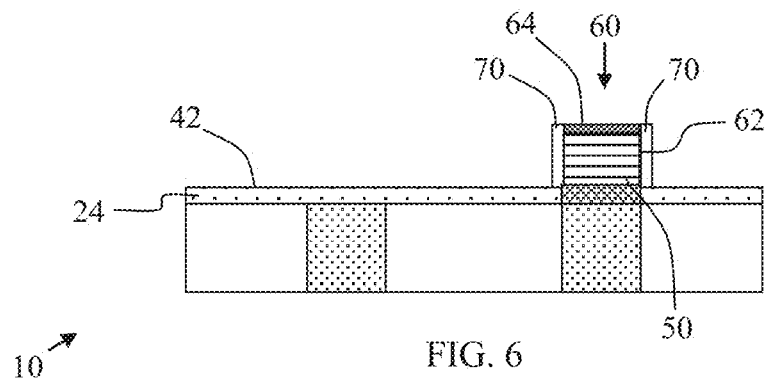

The method may continue in FIG. 6 with the formation of a protective liner 70 on sidewalls 62 of the memory structure stack 60. An exemplary protective liner 70 is a non-oxidizing material, such as a dielectric material. The protective liner 70 may prevent oxidation of the memory structure layers 50. In an exemplary embodiment, the protective liner 70 is silicon nitride. In an exemplary embodiment, the protective liner may be non-selectively deposited over the surface 42 of the blocking layer 24, on the sidewalls 62 of the stack 60, and over the top surface 64 of the stack 60. In an exemplary embodiment, the protective liner 70 is deposited by an ALD process. As shown, if non-selectively deposited, the protective liner 70 may be removed from the top surface 64 of the stack 60 and from the surface 42 of the blocking layer 24 (except for the area of surface 42 directly adjacent the sidewalls 62 of the stack 60). In an exemplary embodiment, the protective liner 70 may be removed by a directional etch process. As a result, the protective liner 70 remains only on the sidewalls 62 of the stack 60.

Figure 7:
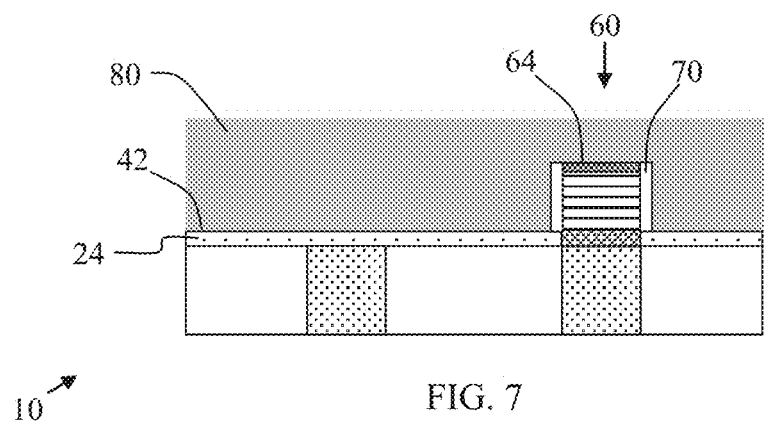

In FIG. 7, the method includes depositing an interlayer dielectric (ILD) material 80 over the surface 42 of the blocking layer 24, around the protective liner 70, and over the top surface 64 of the stack 60. In an exemplary embodiment, the ILD material 80 is silicon oxide. In an exemplary embodiment, the ILD material 80 is deposited by a flowable CVD process. As a result, the ILD material 80 may fill gaps between adjacent MTJ stacks 60 formed in array of MTJ stacks 60. The method may further include annealing the ILD material 80 and planarizing the ILD material 80.

Figure 8:
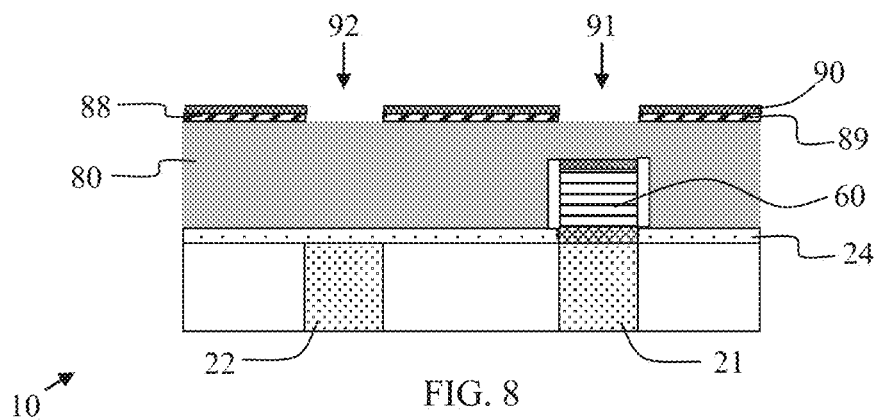

The method may continue in FIG. 8 with the deposition and patterning of a lower mask 88 over the ILD material 80. In an exemplary embodiment, the lower mask 88 is formed of two or more sublayers, such as sublayer 89 and sublayer 90. For example, lower mask 88 may include a bottom sublayer 89 for protecting the underlying ILD material 80, and a top sublayer 90 over the bottom sublayer 89. In an exemplary embodiment, the bottom sublayer 89 is a barrier layer. In an exemplary embodiment, the top sublayer 90 is a metal hard mask such as a titanium nitride (TiN) layer. The components of the lower mask 88 may deposited by CVD, PVD, or PECVD processes.

As shown in FIG. 8, both sublayers of the lower mask 88 may be patterned by selective masking and etching according to conventional lithography processes. For example, a metal lithography process may be used to remove portions of the metal top sublayer 90 before another etching process is used to remove the underlying bottom sublayer 89. As shown, the lower mask 88 is etched to form a first opening 91 over the memory structure stack 60 and a second opening 92 over the second conductive interconnect 22. In an exemplary embodiment, the first opening 91 has a same width as the memory structure stack 60 (which has a same width as the first conductive interconnect 21), and the second opening 92 has a same width as the second conductive interconnect 22. In other embodiments, the first opening 91 and memory structure stack 60 may have different widths, and/or the second opening 92 and second conductive interconnect 22 may have different widths.

Figure 9:
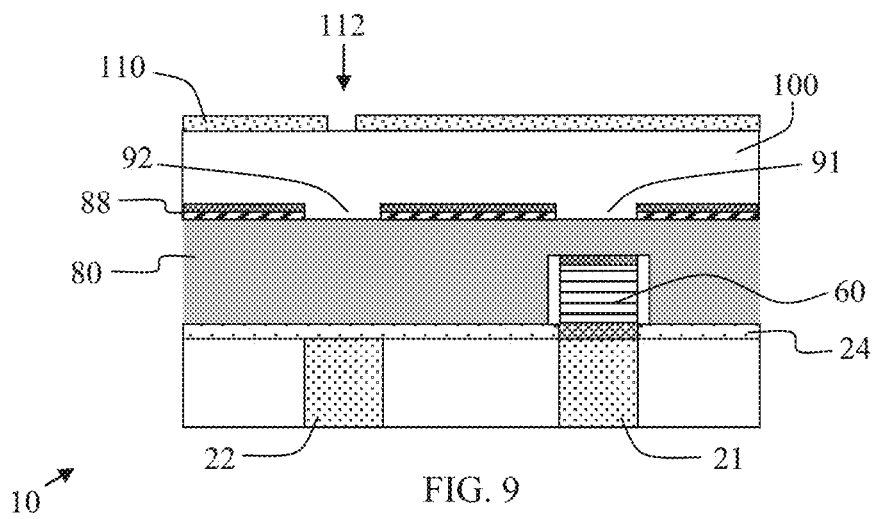

In FIG. 9, an intermask material 100 is deposited over the lower mask 88 and in the openings 91 and 92 onto the ILD material 80. In an exemplary embodiment, the intermask material 100 is a material suitable for lithography. The mask material may be spun on or deposited by CVD processing or by other methods. As further shown, an upper mask 110 is formed over the intermask material 100 and is patterned. An exemplary upper mask 110 is a photoresist mask. The upper mask 110 may be patterned, such as by photolithography, to form an opening 112 over the opening 92 in the lower mask 88 and over the second conductive interconnect 22.

Figure 10:
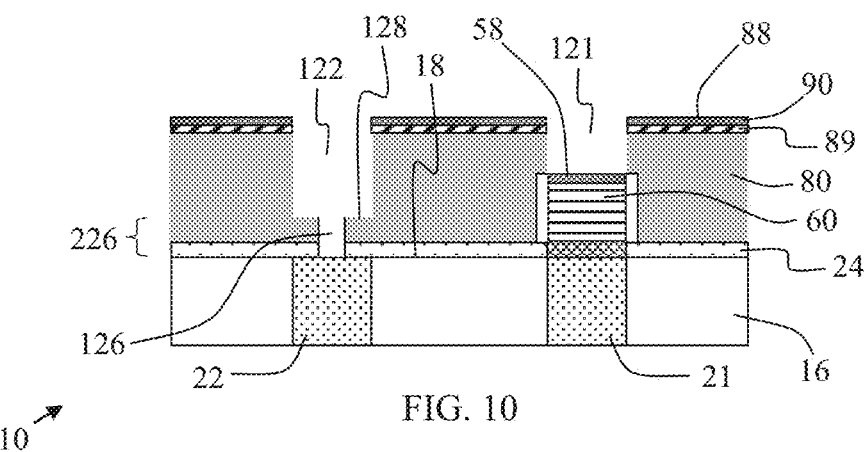

In FIG. 10, a multiple step etch process is performed to form wide trenches 121 and 122 into the ILD material 80 and to form a narrow via hole 126 through the ILD material 80 and through the blocking layer 24 into contact with the second conductive interconnect 22. The multiple step etch process may be performed in accordance with conventional processing and opening of hardmasks and underlying layers. For example, a first etch may be performed through the upper mask 110 before a second etch is performed through the lower mask 88.

As shown, the etch process forms the trenches 121 and 122. Trench 121 lands on the memory structure stack 60 while trench 122 ends in the ILD material 80 at a trench bottom 128. An exemplary trench bottom 128 is located at a height or level lower than, i.e., vertically below, the protective etch stop layer 58 and higher than, i.e., vertically above, the blocking layer 24. It is noted that the protective etch stop layer 58 prevents etching of the memory structure stack 60 and may serve as an etch stop on which trench 121 lands. As shown, each of the trenches 121 and 122 has a width that may be the same as the width of the memory structure stack 60 and interconnects 21 and 22. In other embodiments, the widths of the trenches 121 and 122, memory structure stack 60, and/or interconnects 21 and 22 may differ.

As shown, the etch process forms the via hole 126 extending from the trench bottom 128 of trench 122 to the surface 18 of the second conductive interconnect 22. Via hole 126 is formed with a height 226 that is defined as the vertical distance from the upper surface 18 to the trench bottom 128. In an exemplary embodiment, the height 226 of the via hole 126 is from about 10 nm to about 90 nm. An exemplary via hole 126 is formed with a width that is smaller than the width of the trenches 121 and 122. For example, the width of via hole 126 may be less than half of the width of each trench 121 and 122. It is contemplated that in certain embodiments the via hole 126 may be formed with the same width as the trenches 121 and 122.

Figure 11:
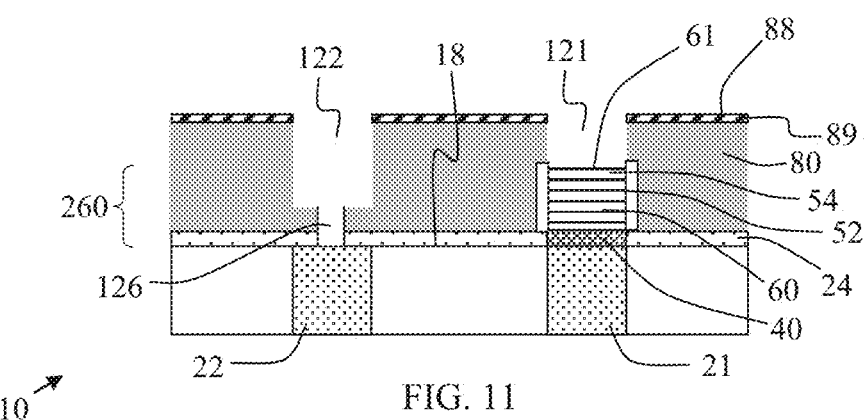

In FIG. 11, the protective etch stop layer 58 is removed from over the memory structure stack 60. In an exemplary embodiment, the upper sublayer 90 of the lower mask 88 is formed from the same material as the protective etch stop layer 58 and is also removed. In an exemplary embodiment, the protective etch stop layer 58 and the upper sublayer 90 of the lower mask 88 are titanium nitride. In an exemplary embodiment, the protective etch stop layer 58 and the upper sublayer 90 of the lower mask 88 are removed by an etch or clean process. As a result of the removal of protective etch stop layer 58, the capping layer 54 of the memory structure layers 50 is exposed as an uppermost surface 61 of the memory structure stack 60. As indicated above, the capping layer may be formed from cobalt.

As a result of the processing described in FIGS. 1-11, the memory structure stack 60 is formed with a height 260 that is defined as the vertical distance from surface 18 to uppermost surface 61. Thus, height 260 of the memory structure stack 60 is equal to the sum of the vertical thicknesses or heights of the conductive material 40, the MTJ layers 52, and the capping layer 54. In an exemplary embodiment, the height 260 of the memory structure stack 60 is from about 30 nm to about 90 nm.

Cross-referencing FIGS. 10 and 11, the processing described allows for formation of a memory structure stack 60 having a height 260 that is greater than the height 226 of the via hole 126.

Figure 12:
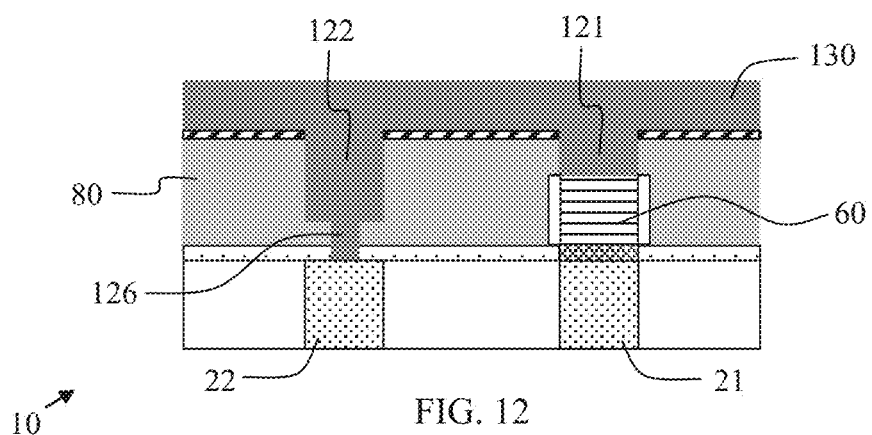

The method may continue in FIG. 12, where a metallization process is performed. Specifically, a conductive material such as a metal 130 is deposited over the ILD 80 and into the trenches 120 and via hole 126. As shown, the metal 130 in the trench 121 contacts the uppermost surface of the capping layer of the memory structure stack 60 and the metal 130 in the via hole 126 contacts the second conductive interconnect 22. In an exemplary embodiment, the metal 130 is the same metal as the conductive interconnects 21 and 22. For example, the metal 130 may be copper. In an exemplary embodiment, the metal 130 is deposited by a sputtering process, an electroplating process, an electroless process or other suitable process.

Figure 13:
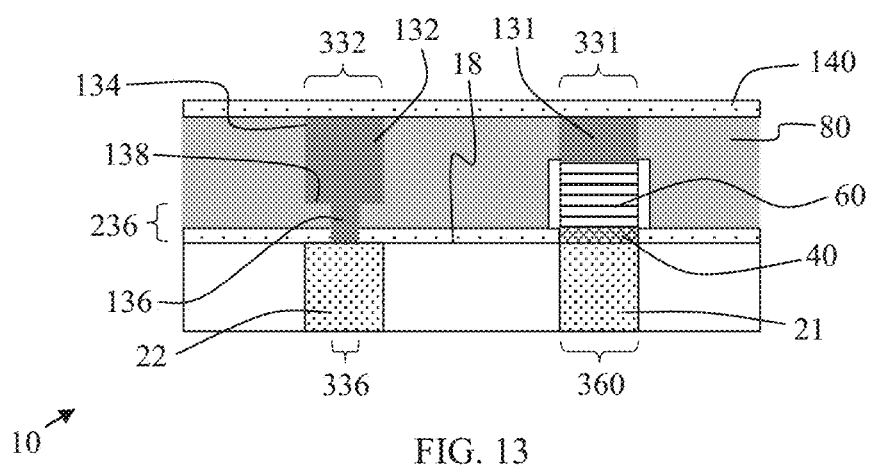

In FIG. 13, the method includes a planarization process to remove the overburden portion of the metal 130 and the remaining portion of sublayer 89 of the lower mask 88 (shown in FIGS. 11-12). As a result, in FIG. 13, a first contact plug 131 is formed in the ILD 80, over and coupled to the memory structure stack 60 and the first conductive interconnect 21. Further, a metallization contact or conductive vertical interconnect access (via) 136 and a second contact plug 132 are formed in the ILD 80, over and coupled to the second conductive interconnect 22. The second contact plug 132 extends downward and terminates at a bottom surface 138. The conductive via 136 is directly coupled to the bottom surface 138 of the second contact plug 132 and extends downward to into direct contact with the second conductive interconnect 22.

The conductive via 136 has a height 236 equal to the height 226 of the via hole 126 (shown in FIG. 10). Cross-referencing FIG. 13 and FIG. 11, the processing described allows for formation of a memory structure stack 60 having a height 260 that is greater than the height 236 of the via 136. In exemplary embodiments, height 236 may be less than about 95%, such as less than 90%, for example less than 85% of the height 260. Further, in embodiments, height 236 may be less than about 80%, such as less than 75%, for example less than 70% of the height 260. Still in other embodiments, height 236 may be less than about 65%, such as less than 60%, for example less than 55% or less than 50% of the height 260.

As shown in FIG. 13, the first contact plug 131 has a width 331 and the second contact plug 132 has a width 332. In certain embodiments, width 331 and width 332 may be substantially equal. Further, the conductive via 136 has a width 336 in contact with the second conductive interconnect 22 at surface 18. Conductive via 136 may have substantially vertical sidewalls and a constant width from surface 18 to trench bottom 128 Also, the memory structure stack 60 has a minimum width 360. For example, due to processing, certain layers of the memory structure stack 60 may be formed with widths that are less than the widths of other layers of the memory structure stack 60. The minimum width 360 is the smallest width of any layer of the memory structure stack 60. In certain exemplary embodiments, the minimum stack width 360 is greater than the conductive via width 336.

As further shown in FIG. 13, a barrier layer 140 is formed over the ILD 80, first contact plug 131 and second contact plug 132. An exemplary barrier layer 140 is formed from the same material as the blocking layer 24 described above in relation to FIG. 1. For example, the barrier layer 140 may be nitrogen doped carbide (NDC) or nitrogen-doped silicon carbide diffusion layer.

As described herein, an exemplary integrated circuit is provided with a memory structure, such as an MRAM structure like an MTJ stack, embedded in a metallization layer. The exemplary memory structure is formed with a greater height than the height of conductive vias formed to neighboring conductive interconnects in the same metal level. Further, embodiments herein may utilize cobalt as a highly conductive layer and etch stop. The methods described herein provide for the integration of logic and memory structures seamlessly. Also, while often described in the context of MRAM, the method employed herein may be used in RRAM technology. Further, the processes described herein are similar to processes in conventional CMOS processing such that necessary process equipment and actions are available.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof

What is claimed is:

1. An integrated circuit with an embedded memory structure comprising:
 a conductive interconnect disposed over a semiconductor substrate;
 a conductive layer formed from cobalt material within an insulator layer and disposed on an upper surface of the conductive interconnect;
 a memory stack disposed directly on an upper surface of the conductive layer and formed from cobalt material; and
 a contact plug coupled to the memory stack, the contact plug having an upper surface substantially coplanar with an upper surface of the insulator layer and an adjacent contact plug within the insulator layer,
 wherein the conductive interconnect includes a set of sidewalls that are substantially vertically aligned with sidewalls of each of the conductive layer, the memory stack, and the contact plug.

2. An integrated circuit with an embedded magnetic tunnel junction (MTJ) structure comprising:
 a conductive interconnect disposed over a semiconductor substrate;
 a bottom layer of highly conductive material within an insulator layer and disposed over the conductive interconnect;
 a magnetic tunnel junction (MTJ) stack disposed over the bottom layer; and
 a first contact plug contacting the MTJ stack, the first contact plug having an upper surface substantially coplanar with an upper surface of the insulator layer,
 a second contact plug within the insulator layer having a lower surface substantially coplanar with a lower surface of the bottom layer of highly conductive material, and an upper surface substantially coplanar with the upper surface of the first contact plug and the upper surface of the insulator layer,
 wherein the conductive interconnect includes a set of sidewalls that are substantially vertically aligned with sidewalls of each of the bottom layer of highly conductive material, the MTJ stack, and the contact plug.

3. The integrated circuit of claim 2 wherein the conductive interconnect and contact plug are formed from a same metal.

4. The integrated circuit of claim 2 wherein the highly conductive material is cobalt or a cobalt alloy.

5. The integrated circuit of claim 2 wherein the MTJ stack has sidewalls and further comprising a non-oxidizing liner on the sidewalls of the MTJ stack.

6. The integrated circuit of claim 2 wherein the conductive interconnect is a first conductive interconnect and the contact plug is a first contact plug, \ and wherein the integrated circuit further comprises:
 a second conductive interconnect disposed over the semiconductor substrate;
 the second contact plug coupled to the second conductive interconnect, wherein the highly conductive material is not located between the second conductive interconnect and the second contact plug.

7. The integrated circuit of claim 2, wherein:
 the MTJ stack has an uppermost surface at a first height over the semiconductor substrate;
 the conductive interconnect is a first conductive interconnect and the contact plug is a first contact plug;
 the integrated circuit further comprises:
 a second conductive interconnect disposed over the semiconductor substrate;
 a conductive via disposed over and coupled to an upper surface of the second conductive interconnect, the second contact plug being coupled to an upper surface of the conductive via; and
 the conductive via extends away from the substrate and terminates at a second height over the substrate, wherein the second height is less than the first height.

8. An integrated circuit (IC) structure, comprising:
 a conductive interconnect over a semiconductor substrate;
 a cobalt-based conductive layer within an insulator layer, positioned on and contacting an upper surface of the conductive interconnect;
 a memory stack positioned on and contacting an upper surface of the cobalt-based conductive layer; and
 a contact plug coupled to the memory stack, the contact plug having an upper surface substantially coplanar with an upper surface of the insulator layer and an adjacent contact plug within the insulator layer,
 wherein the conductive interconnect includes a set of sidewalls that are substantially vertically aligned with sidewalls of each of the cobalt-based conductive, the memory stack, and the contact plug.

9. The IC structure of claim 8, wherein the conductive interconnect includes cobalt or a cobalt alloy.

10. The IC structure of claim 8, wherein the memory stack comprises a magnetic tunnel junction (MTJ) stack.

11. The IC structure of claim 8, wherein the memory stack has sidewalls and further comprising a non-oxidizing liner on the sidewalls of the memory stack.

12. The IC structure of claim 8, wherein the conductive interconnect is a first conductive interconnect and the contact plug is a first contact plug, the adjacent contact plug is a second contact plug, and wherein the IC structure further comprises:
   a second conductive interconnect disposed over the semiconductor substrate;
   the second contact plug coupled to the second conductive interconnect, wherein the highly conductive material is not located between the second conductive interconnect and the second contact plug.

13. The IC structure of claim 8, wherein the memory stack has an uppermost surface at a first height over the semiconductor substrate, the conductive interconnect is a first conductive interconnect and the contact plug is a first contact plug, the adjacent contact plug is a second contact plug, and wherein the IC structure further comprises:
   a second conductive interconnect disposed over the semiconductor substrate;
   a conductive via disposed over and coupled to an upper surface of the second conductive interconnect; and
   the second contact plug coupled to an upper surface of the conductive via; and
   the conductive via extends away from the substrate and terminates at a second height over the substrate, wherein the second height is less than the first height.

\* \* \* \* \*